US008633371B2

(12) United States Patent
McCullough et al.

(10) Patent No.: US 8,633,371 B2
(45) Date of Patent: Jan. 21, 2014

(54) DEVICE AND METHOD FOR GENERATING ELECTRICAL POWER

(75) Inventors: Edward D. McCullough, Riverside, CA (US); James P. Huang, Huntington Beach, CA (US)

(73) Assignee: The Boeing Company, Chicago, IL (US)

( * ) Notice: Subject to any disclaimer, the term of this patent is extended or adjusted under 35 U.S.C. 154(b) by 152 days.

(21) Appl. No.: 11/937,571

(22) Filed: Nov. 9, 2007

(65) Prior Publication Data

US 2009/0120482 A1    May 14, 2009

(51) Int. Cl.
H01L 35/00 (2006.01)
H01L 37/00 (2006.01)
H01L 35/34 (2006.01)
H01L 35/30 (2006.01)

(52) U.S. Cl.
USPC ............ 136/205; 136/200; 136/201; 136/206

(58) Field of Classification Search
USPC .................................................. 136/200, 205
See application file for complete search history.

(56) References Cited

U.S. PATENT DOCUMENTS

| | | | |
|---|---|---|---|
| 3,056,848 A | | 10/1962 | Meyers |
| 3,306,782 A | * | 2/1967 | Hagler et al. .................. 136/208 |
| 3,372,469 A | * | 3/1968 | Langrod ........................ 136/201 |
| 4,420,940 A | * | 12/1983 | Buffet .............................. 62/3.2 |
| 4,650,919 A | * | 3/1987 | Benson et al. ................. 136/212 |
| 4,773,847 A | * | 9/1988 | Shukla et al. ................... 431/46 |
| 6,233,944 B1 | | 5/2001 | Yamada et al. |
| 6,307,142 B1 | * | 10/2001 | Allen et al. .................... 136/205 |
| 6,799,282 B2 | * | 9/2004 | Maeda et al. .................. 713/500 |
| 2003/0209802 A1 | | 11/2003 | Awano |
| 2004/0005736 A1 | * | 1/2004 | Searls et al. .................. 438/122 |
| 2004/0076214 A1 | | 4/2004 | Bell |
| 2005/0126618 A1 | | 6/2005 | Muller-Werth |
| 2009/0250091 A1 | * | 10/2009 | Huang et al. .................. 136/205 |

FOREIGN PATENT DOCUMENTS

| | | |
|---|---|---|
| EP | 1571718 | 9/2005 |
| FR | 2550324 A1 * | 2/1985 |
| JP | 07123758 | 5/1995 |
| JP | 07221352 | 8/1995 |
| WO | 01/80325 | 10/2001 |

OTHER PUBLICATIONS

English machine translation of FR 2550324A1.*

(Continued)

*Primary Examiner* — Jonathan Johnson
*Assistant Examiner* — Lindsey Bernier
(74) *Attorney, Agent, or Firm* — Moore & Van Allen PLLC

(57) ABSTRACT

A device and method for generating electricity. The device includes a heat source, a cold source, and a thermoelectric generating plate, having a first side and an opposed side. When heat is introduced to the heat source, heat flows across the thermoelectric generating plate and electricity is generated. In the present arrangement, because the hot and cold sources are in thermal communication with opposed sides of the thermoelectric generating plate, the thermal gradient or rate of heat flow across the thermoelectric generating plate is maximized. Thus, because the rate of heat flow is increased, the rate at which electricity is generated is also increased, and the size of the device is maintained, or minimized.

24 Claims, 3 Drawing Sheets

(56) References Cited

OTHER PUBLICATIONS

Crane, D.T. et al. "Progress Towards Maximizing the Performance of a Thermoelectric Power Generator." BSST, LLC, 5462 Irwindale Ave., Irwindale, CA 91706.

Gomez, Alessandro et al. "From jet fuel to electric power using a mesoscale, efficient Stirling cycle." Proceedings of the Combustion Institute 21 (2007) 3251-3259.

Radebaugh, Ray et al. "Measurement of High Efficiency in Hg0.86Cd0.14Te Thermionic Converters." Physical and Chemical Properties Division, National Institute of Standards and Technology, Boulder Colorado 80305, Dec. 7, 2001.

Wickman, John. "Using Lunar Soil for Propellants & Concrete." Ad Astra—Mar./Apr. 2002 (vol. 14, No. 2), http://www.wickmanspacecraft.com/moon1.html.

International Search Report, corresponding to International Patent Application No. PCT/US2008/078969, dated Oct. 19, 2009.

Written Opinion, corresponding to International Patent Application No. PCT/US2008/078969, dated Oct. 19, 2009.

\* cited by examiner

DEVICE AND METHOD FOR GENERATING ELECTRICAL POWER

BACKGROUND

The present disclosure relates to a device and system for generating electricity. In particular, the present disclosure relates to a device and method for generating electricity through the use of thermoelectric generators.

At present, there are many ways of generating power for use in powering electronic devices. Most prevalent is the use of direct current or alternating current by means of a battery supply. Battery supplied power is limited and requires recharging. Recharging requires access to a power supply. Moreover, battery supplied power can be heavy as batteries become increasingly heavier as the power requirement increases. For example a battery having a higher power output will typically be heavier than one having a lower power output. Some batteries are lighter than others depending upon the materials used, but increase relatively in weight and size as the power requirements increase.

In some situations, there is a need for a continuous power supply for use in powering personal electronic devices, such as a cell phone or personal digital assistant, or the like. In particular, there is a need for a power supply for use in powering electronic devices used remotely, primarily by military and rescue personnel. Presently, portable power systems do not provide sufficient power for an extended period of time. Thus, additional power supplies must be carried as back-up power supplies, or a recharging system requiring access to electricity.

Thus, there is a need for an improved, light weight, compact, sustainable power supply.

SUMMARY OF THE INVENTION

In accordance with an embodiment of the present disclosure a device for generating electricity may include a heat source, a cold source, and a thermoelectric generating plate. The thermoelectric generating plate includes a hot side and a cold side. The hot side of the thermoelectric generating plate is in thermal communication with the heat source and the cold side of the thermoelectric generating plate is in thermal communication with the cold source. Heat flux across the thermoelectric generating plate causes electrical power to be generated.

In accordance with another embodiment of the present disclosure, a device for generating electrical power may include a heat source, a cold source, and a thermoelectric generator stack. The thermoelectric generator stack may include a plurality of thermoelectric generators, each generator including a cold side and a hot side. The thermoelectric generator stack may also include a first plurality of thermal elements. Each of the first plurality of thermal elements may be thermally coupled to the heat source and to the hot side of an associated one of the plurality of thermoelectric generators to transfer thermal energy from the heat source to the thermoelectric generator. The thermoelectric generator may further include a second plurality of thermal elements. Each of the second plurality of thermal elements may be thermally coupled to the cold source and to the cold side of the associated one of the plurality of thermoelectric generators to transfer thermal energy from the thermoelectric generator to the cold source. Heat generated by the heat source causes a thermal gradient across each of the thermoelectric generators to generate electrical energy.

In accordance with another embodiment of the present disclosure, an electrically powered device may include electrical circuitry to perform a predetermined function. The electrically powered device may also include a device for generating electrical power to operate the electrical circuitry. The device for generating electrical power may include a thermoelectric generator stack. The thermoelectric generator stack may include a plurality of thermoelectric generators or plates. Each generator or plate may include a cold side and a hot side. The thermoelectric generator stack may also include a first plurality of thermal elements. Each of the first plurality of thermal elements may be thermally coupled to a heat source and to the hot side of an associated one of the plurality of thermoelectric generators to transfer thermal energy from the heat source to the thermoelectric generator. Each of the second plurality of thermal elements may be thermally coupled to a cold source and to the cold side of the associated one of the plurality of thermoelectric generators to transfer thermal energy from the thermoelectric generator to the cold source, wherein heat generated by the heat source causes a thermal gradient across each of the thermoelectric generators to generate electrical energy.

In accordance with a further embodiment of the present disclosure, a method for generating electrical power may include creating a thermal gradient across each of a plurality of thermoelectric generators formed in a generator stack. The generator stack may be formed by stacking a first plurality of thermal elements each thermally coupled to a heat source and to a hot side of an associated one of the plurality of thermoelectric generators to transfer thermal energy from the heat source to the thermoelectric generator. The generator stack may also be formed by stacking a second plurality of thermal elements each thermally coupled to a cold source and to a cold side of the associated one of the plurality of thermoelectric generators to transfer thermal energy from the thermoelectric generator to the cold source, wherein the thermal gradient across each of the thermoelectric generators generates electrical energy. The method may also include supplying the electrical power to a connector to power an electrical device.

Features and advantages of the present disclosure will become more apparent in light of the following detailed description of some embodiments thereof, as illustrated in the accompanying Figures. As will be realized, the disclosure is capable of modifications in various respects, all without departing from the spirit and scope of the disclosure. Accordingly, the drawings and the description are to be regarded as illustrative, and not as restrictive in nature.

DESCRIPTION

The disclosure will now be described with reference to the accompanying drawings which illustrate disclosed embodiments of the device and method for generating electrical power of the present disclosure falling within the scope of the appended claims. Other embodiments having different structures and operations do not depart from the scope of the present disclosure.

Figure 1:
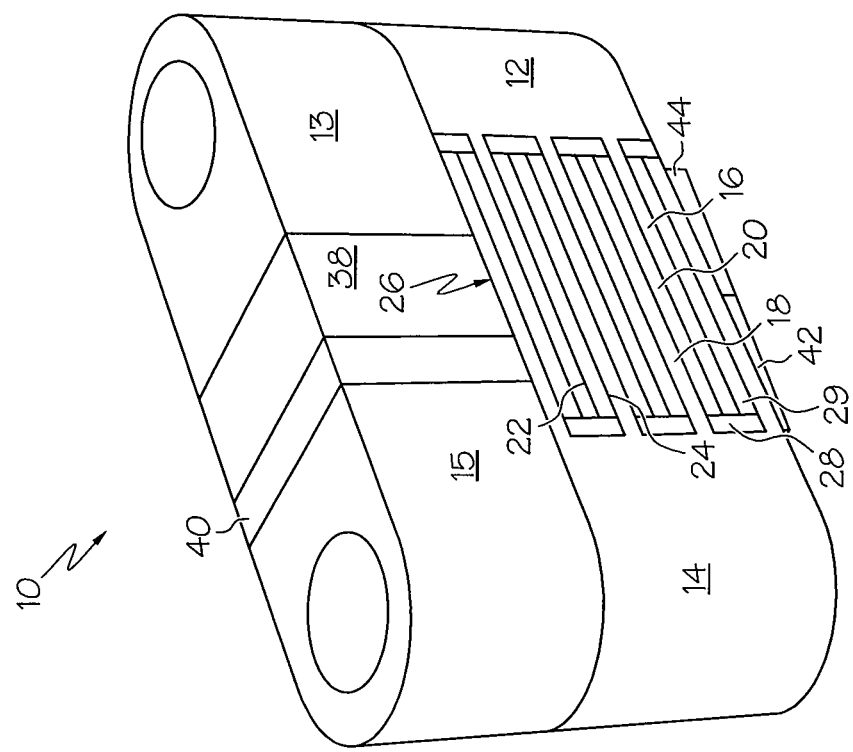
FIG. 1 is a perspective view of an example of a device for generating electrical power in accordance with an embodiment of the present disclosure.

Referring now in more detail to the drawings in which like numbers indicate like parts throughout the several views, FIG. 1 is a perspective view of a device 10 for generating electrical power in accordance with an embodiment of the present disclosure. The device 10 includes a heat pipe stack 12 and a cold pipe stack 14. The heat pipe stack 12 is in thermal communication with a heat source 13. Examples of the heat source 13 may include a combustion chamber, magnesium burner or any heat source that is compact and light weight. The heat source may also include a solar based heat source. The cold pipe stack 14 is in thermal communication with a cold source 15. Examples of the cold source 15 may include a cooling fan to exhaust to the atmosphere, a heat sink or other device. The cold source 15 may also just be a surface area exposed to the air or atmosphere or a vent to air. It should be noted that other devices for generating heat such as a combustion chamber may be used in lieu of the magnesium burner 13. Also, the cooling fan 15 may be substituted with other known means to remove heat from a space.

Figure 2:
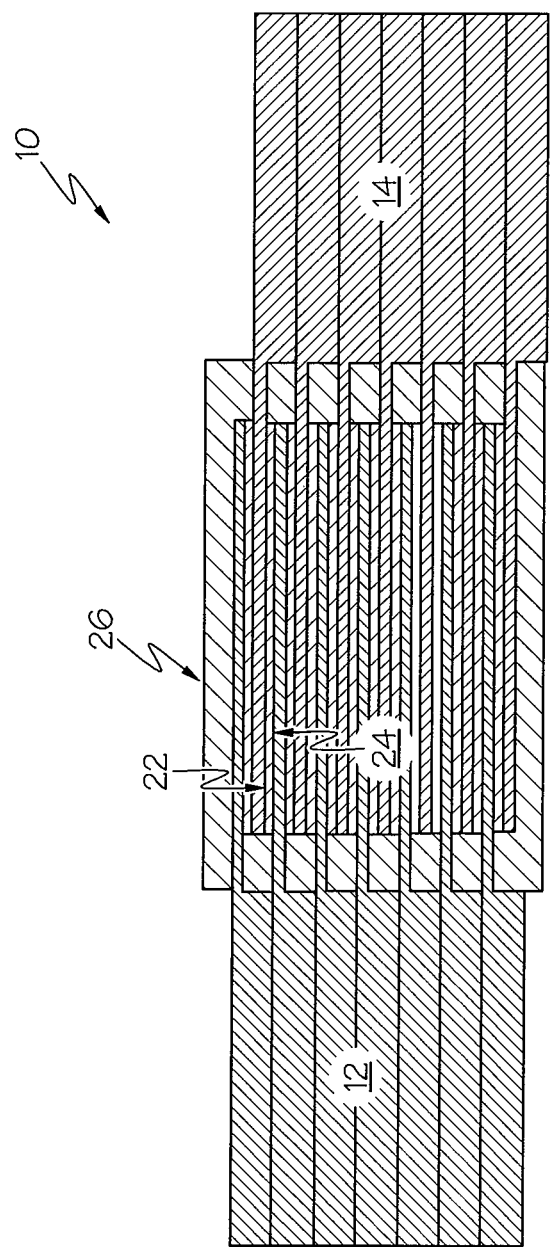
FIG. 2 is a cross-sectional view of a portion of the device of FIG. 1 illustrating a thermoelectric stack in accordance with an embodiment of the present disclosure.

Referring also to FIG. 2, FIG. 2 is a cross-sectional view of a portion of the device 10 of FIG. 1 illustrating a thermoelectric stack 26 in accordance with an embodiment of the present disclosure. The thermoelectric stack 26 includes a series of thermal elements, such as heat pipes 16, cold pipes 18, and thermoelectric generators 20 or plates in a particular order. In one embodiment, the heat pipes 16 and cold pipes 18 may be nano pipes, nano tubes or the similar thermal elements The heat 16 and cold pipes 18 are to be made of anything that is thermally conductive such as copper, aluminum nitride or the like. As shown in FIG. 2, the heat pipes 16 extend outwardly in a parallel fashion from the heat source 13 in at least one direction. The heat pipes 16 are thermally coupled to the heat source 13 in such a way as to ensure effective heat transfer from the heat source to and through the heat pipes 16. Similarly as shown in FIG. 2, the cold pipes 18 extend from the cold source 15 in a parallel fashion and in an opposed direction to the heat pipes 16 so that the cold pipes and heat pipes overlap when the device is assembled. The cold pipes 18 are thermally coupled to the cold source 15 in such a way as to ensure effective heat loss from the cold pipes to and through the cold source so as to maintain a low temperature relative to the heat pipe 16.

Sandwiched between each heat pipe 16 and cold pipe 18 in the stack 26 is a thermoelectric generator 20, as shown in FIG. 2. Each thermoelectric generator 20 has a hot side surface 22 and a cold side surface 24. The hot side surface 22 is in thermal contact with the heat pipe 16. The cold side surface 24 is in thermal contact with the cold pipe 18. The thermoelectric generator 20 creates electrical power from the heat flow across a structure. One type of thermoelectric generator is a solid state thermoelectric converter made by Eneco. If the thermal gradient (difference in temperature between the heat source 13 and cold source 15) increases, the flow of heat across a structure increases and thus a greater amount of electrical power or energy may be generated. At a minimum, a stack 26 would include at least one heat pipe 16 and at least one cold pipe 18 with a thermoelectric generator 20 sandwiched in between. Moreover, it is preferred that the hot side surface 22 and the heat pipe 16 be made of materials having coefficients of thermal expansion that differ by no more than 10%. Similarly, it is preferred that the cold side surface 24 and the cold pipe be made of materials having coefficients of thermal expansion that differ by no more than 10%. When the coefficients of thermal expansion are similar between the hot 22 and cold side 24 surfaces and the heat 16 and cold pipes 18, the device 10 funtions more effectively because the interaction between the surfaces (cold pipe and cold side, and heat pipe and hot side surface) expand and contract at similar rates so the heat transfer is more efficient.

The stack 26 arrangement of heat pipes 16, cold pipes 18 and thermoelectric generators 20 enables the device 10 to be arranged in a compact manner while generating greater levels of electrical power or energy than presently provided by existing systems. Moreover, the stacking arrangement of the exemplary embodiment of the present disclosure illustrated in the Figures allows for a greater heat flow across each thermoelectric generator 20 and increases the effectiveness of each generator 20 and the device 10 as a whole. Thus, the device 10 of the illustrated embodiment of the present disclosure enables a greater amount of electrical power or energy to be generated while enabling the size and weight of the device 10 to decrease.

Returning to FIG. 1, insulating material 28 is positioned between the cold pipes 18 and the hot heat pipes 16. The insulating material 28 inhibits the transfer of heat from the hot heat pipe 16 directly to the cold pipe 16. By preventing heat flow between the heat pipe 16 and cold pipe 18 outside the stack 26, the insulating material 28 further enables the device 10 to more effectively produce a greater amount of electricity. The insulating material 28 may include an alumina enhanced thermal barrier or similar insulating material. A thermal chip module layer 29 may be embedded in the alumina enhanced thermal barrier.

A power conditioner and plug 38 or outlet are electrically connected to the thermoelectric generators 20 of the device 10 so as to provide the user with a way of transferring or supplying the electrical power from the device 10 to the user's electronic device.

A control module 40 may also be associated with the device 10 to control the operation of the device 10. The set of control functions to be considered may include: controlling the rate of fuel to be combusted to produce the heat source for the hot side. In particular, the control module 40 may regulate the burn rate of the magnesium or other fuel in such a way in order to maintain the proper temperatures and thermo gradients in the device 10 for effective operation. Additional control functions may include controlling the operation of fans for cooling the cold side, and controlling the level of voltage to be generated for interfacing with intended application device.

The device 10 further includes a warm start battery 42 and a cold start module 44 The warm start battery stores enough energy to add and ignite fuel for a hot system restart after the system has been turned off for a period of time. The cold start module can be a hand crank generator which charges the warm start battery 42. It allows the start of the device 10 if battery 42 is discharged.

In a one embodiment, it is anticipated that the overall dimensions of the device 10 would be about 74 mm high, 125 mm wide and 43 mm thick, and would include six layers of thermoelectric generators capable of generating a total of 300 watts of power from the device 10. It is appreciated that the dimensions would vary with changes to design, function and power generating capability of the device 10.

Figure 3:
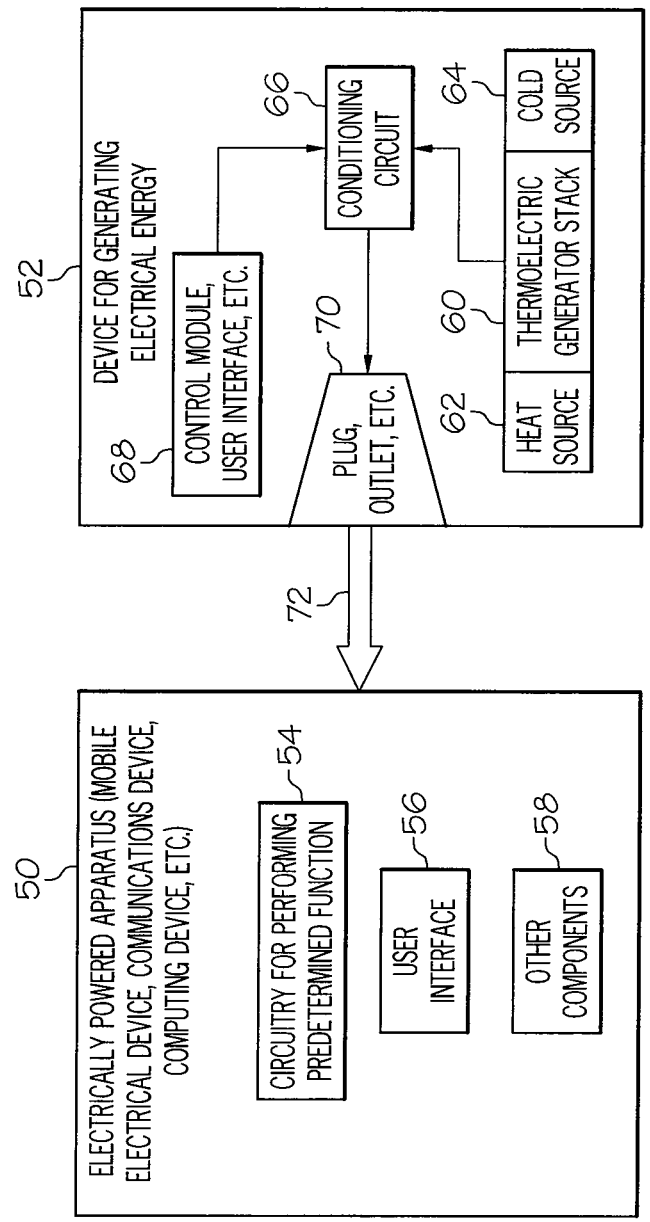
FIG. 3 is a block diagram of an example of an electrically powered device powered by a device for generating electrical power in accordance with an embodiment of the present disclosure.

FIG. 3 is a block diagram of an example of an electrically powered apparatus 50 powered by a device 52 for generating electrical power in accordance with an embodiment of the present disclosure. The electrically powered apparatus 50 may be a mobile or portable electrically powered device that heretofore may have been powered by an electric storage battery or other electricity storage device. The electrically power apparatus 50 may be communications device, computing device or other electrical device.

The electrically powered apparatus 50 may include circuitry 54 for performing a predetermined function. For example in the case of a communications device, the circuitry 54 may include a transmitter and a receiver. The apparatus 50 may also include a user interface 56 to permit a user to control the device. The interface 56 may include a keypad, keyboard, computer pointing device or mouse, display or any other means to permit a user to operate and control the apparatus 50. The electrically powered apparatus 50 may also include other components, such as a data storage device, file system, processing unit or the like.

The device 52 for generating electrical energy of power may be similar to the device 10 in FIG. 1. The device 52 may include a thermoelectric generator stack 60. The thermoelectric generator stack 60 may be similar to the generator stack 26 in FIGS. 1 and 2 and may operate in a substantially similar manner. The thermoelectric stack 60 may be thermally coupled to a heat source 62 and a cold source 64 to create a thermal gradient across the thermoelectric generators or plates in the thermoelectric stack 60 to generate electrical energy.

Electrical energy generated by the thermoelectric stack 60 may be conditioned by a conditioning circuit 66. The conditioning circuit 66 may be controlled by a control module 68 so that the appropriate voltage and current levels are supplied to the electrically powered apparatus 50. The control module 68 may include a user interface or the interface may be separate from the control module 68 to permit a user to select the appropriate voltage and current and any other parameters associated with the electrical power to be supplied to the apparatus 50.

The device 52 may also include a plug, outlet or similar means for supplying the electrical power to the apparatus 50. An electrical cable or power cord 72 may also be provided to connect the device 52 to the apparatus 50. In another embodiment of the present disclosure, the device 52 may be integrated into the apparatus 50.

The following claims are in no way intended to limit the scope of the disclosure to the specific embodiments described. It should be understood by those skilled in the art that the foregoing modifications as well as various other changes, omissions and additions may be made without parting from the spirit and scope of the present disclosure.

The invention claimed is:

1. A device for generating electrical power, comprising:
a portable heat source;
a cold source;
a first plurality of thermal elements arranged in a heat stack on a first side of the device, the heat stack thermally coupled to the portable heat source, the first plurality of thermal elements extending from the heat stack, parallel to and separated from one another, the heat stack being comprised of the first plurality of thermal elements being in direct contact with each other or with the first plurality of thermal elements projecting from a solid, integral form;
a second plurality of thermal elements each extending parallel to one another from a cold stack positioned only on a second side of the device opposite the first side, the cold stack thermally coupled to the cold source, wherein at least one element of the heat stack is in-between two elements of the cold stack in a stacking direction, the first plurality of thermal elements and the second plurality of thermal elements separating the heat stack from the cold stack;
a thermoelectric generator plate sandwiched between each one of the first plurality of thermal elements and a respective one of the second plurality of thermal elements, each thermoelectric generator plate including a hot side and a cold side, wherein the hot side and the cold side of each thermoelectric generator plate is stacked in the stacking direction,
wherein each of the first plurality of thermal elements, the second plurality of thermal elements, and the thermoelectric generator plate sandwiched therebetween are positioned between the heat stack and the cold stack to provide a portable device.

2. The device of claim 1, further comprising a thermally conductive hot element in thermal communication with the heat source and with the hot side of the thermoelectric generating plate, and a thermally conductive cold element in thermal communication with the cold source and with the cold side of the thermoelectric generating plate.

3. The device of claim 2, further comprising an insulating element positioned in-between the distal end of the extending cold element and the heat source, and between the distal end of the extending hot element and the cold source.

4. The device of claim 1, wherein the heat source comprises a magnesium burner.

5. The device of claim 1, wherein the heat source comprises a combustion chamber.

6. The device of claim 1, wherein the cold source comprises a cooling fan.

7. The device of claim 2, wherein the hot and cold elements comprise nano tubes.

8. The device of claim 1, wherein the hot and cold sides of each thermoelectric generator plate are made of material where the coefficient of thermal expansion of the hot and cold sides differ by no more than 10% from each of the first plurality of thermal elements and the second plurality of thermal elements respectively.

9. The device of claim 1, further comprising an interface to apply electrical power to an electrically powered device.

10. The device of claim 9, wherein the electrically powered device comprises one of a communications device and a computing device.

11. A device for generating electrical power, comprising:
a portable heat source;
a cold source;
a thermoelectric generator stack, wherein the thermoelectric generator stack comprises:
a plurality of thermoelectric generators, each generator including a cold side and a hot side;
a first plurality of thermal elements arranged in a heat stack on a first side of the device, the heat stack thermally coupled to the portable heat source, the first plurality of thermal elements extending from the heat stack, parallel to and separated from one another and to the hot side of an associated one of the plurality of thermoelectric generators to transfer thermal energy from the heat source to the thermoelectric generator, the heat stack being comprised of the first plurality of thermal elements being in direct contact with each other or with the first plurality of thermal element projecting from a solid, integral form; and
a second plurality of thermal elements each extending parallel to one another earn from a cold stack positioned only on a second side of the device opposite the first side, the cold stack thermally coupled to the cold source and to the cold side of the associated one of the plurality of thermoelectric generators to transfer thermal energy from the thermoelectric generator to the cold source, the first plurality of thermal elements and the second plurality of thermal elements separating the heat stack from the cold stack, wherein heat generated by the heat source causes a thermal gradient across each of the thermoelectric generators to generate electrical energy and wherein at least one of the first plurality of thermal elements is in-between two of the second plurality of thermal elements stacked along a stacking direction, with the associated one of the plurality of thermal generators being sandwiched between each one element of the first plurality of thermal elements and a respective one element of the second plurality of thermal elements in the stacking direction, wherein the stack of the first plurality of thermal elements, the second plurality of thermal elements, and the thermoelectric generator sandwiched therebetween is positioned between the heat stack and the cold stack to provide a portable device.

12. The device of claim 11, wherein each of the thermal elements comprises a nano tube.

13. The device of claim 11, further comprising a warm start battery to start the heat source for generating thermal energy.

14. The device of claim 13, further comprising a cold start module to manually charge the warm start battery.

15. The device of claim 11, wherein the heat source comprises one of a magnesium burner and a solar based source.

16. The device of claim 11, wherein the cold source comprises one of a cooling fan, a heat sink, and a vent from each of the second plurality of thermal elements to air.

17. The device of claim 11, further comprising an insulating material between each of the distal ends of the first plurality of thermal elements and the cold source and between each of the distal ends of the second plurality of thermal elements and the heat source.

18. The device of claim 17, wherein the insulating material comprises an alumina enhanced thermal barrier.

19. The device of claim 11, further comprising a connector to supply electrical power to an electrically powered device.

20. The device of claim 19, wherein the electrically powered device comprises at least one of a mobile communications device and a computing device.

21. An electrically powered apparatus, comprising:
electrical circuitry to perform a predetermined function;
a device for generating electrical power to operate the electrical circuitry, wherein the device includes:
a thermoelectric generator stack, wherein the thermoelectric generator stack comprises:
a portable heat source;
a plurality of thermoelectric generators, each generator including a cold side and a hot side;
a first plurality of thermal elements arranged in a heat stack on a first side of the device, the heat stack thermally coupled to the portable heat source, the first plurality of thermal elements extending from the heat stack, parallel to and separated from one another and to the hot side of an associated one of the plurality of thermoelectric generators to transfer thermal energy from the heat source to the thermoelectric generator, the heat stack being comprised of the first plurality of thermal elements being in direct contact with each other or with the first plurality of thermal element projecting from a solid, integral form;
a second plurality of thermal elements each extending parallel to one another earn from a cold stack positioned only on a second side of the device opposite the first side, the cold stack thermally coupled to the cold source and to the cold side of the associated one of the plurality of thermoelectric generators to transfer thermal energy from the thermoelectric generator to the cold source, the first plurality of thermal elements and the second plurality of thermal elements separating the heat stack from the cold stack, wherein heat generated by the portable heat source causes a thermal gradient across each of the thermoelectric generators to generate electrical energy and wherein at least one of the first plurality of thermal elements is in-between two of the second plurality of thermal elements in a stacking direction, with the associated one of the plurality of thermal generators being sandwiched between each one element of the first plurality of thermal elements and a respective one element of the second plurality of thermal elements in the stacking direction, wherein the stack of the first plurality of thermal elements, the second plurality of thermal elements, and the thermoelectric generator sandwiched therebetween is positioned between the heat stack and the cold stack to provide a portable device.

22. The electrically powered apparatus of claim 21, wherein the electrically powered apparatus comprises one of a mobile communications device and a computing device.

23. A method for generating electrical power, comprising:
creating a thermal gradient across each of a plurality of thermoelectric generators formed in a generator stack, wherein the generator stack is formed by stacking a first plurality of thermal elements arranged in a heat stack on a first side of the device, the heat stack thermally coupled to the portable heat source, the first plurality of thermal elements extending from the heat stack, parallel to and separated from one another and to the hot side of an associated one of the plurality of thermoelectric generators to transfer thermal energy from the heat source to the thermoelectric generator, the heat stack being comprised of the first plurality of thermal elements being in direct contact with each other or with the first plurality of thermal element projecting from a solid, integral form;
and by stacking a second plurality of thermal elements each extending parallel to one another earn from a cold stack positioned only on a second side of the device opposite the first side, the cold stack thermally coupled to a cold source and to a cold side of the associated one of the plurality of thermoelectric generators to transfer thermal energy from the thermoelectric generator to the cold source, wherein the thermal gradient across each of the thermoelectric generators generates electrical energy and wherein at least one of the first plurality of thermal elements is in-between two of the second plurality of thermal elements stacked along a stacking direction, with the associated one of the plurality of thermal generators being sandwiched between each one element of the first plurality of thermal elements and a respective one element of the second plurality of thermal elements in the stacking direction; and supplying the electrical power to a connector for powering an electrical device.

24. The method of claim 23, wherein stacking the first plurality of thermal elements and the second plurality of thermal elements comprises stacking a nano tube in thermal communication with the hot side and the cold side of each thermoelectric generator; and further comprising:
thermally coupling each of the first plurality of thermal elements to one of a magnesium burner and a solar based source; and thermally coupling each of the second plurality of thermal elements to one of a cooling fan, a heat sink, and directly to air.

* * * * *